(12) United States Patent
Fan et al.

(10) Patent No.: US 11,116,101 B2
(45) Date of Patent: Sep. 7, 2021

(54) MOVABLE STANDOFFS WITH POSTS

(71) Applicant: Hewlett-Packard Development Company, L.P., Spring, TX (US)

(72) Inventors: Yao-Wen Fan, Taipei (TW); Yu Wei Tan, Taipei (TW); Sheng-Lung Liao, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/963,547

(22) PCT Filed: Mar. 6, 2018

(86) PCT No.: PCT/US2018/021084
§ 371 (c)(1),
(2) Date: Jul. 21, 2020

(87) PCT Pub. No.: WO2019/172886
PCT Pub. Date: Sep. 12, 2019

(65) Prior Publication Data
US 2020/0396854 A1    Dec. 17, 2020

(51) Int. Cl.
| | |
|---|---|
| *A47B 91/00* | (2006.01) |
| *H05K 7/02* | (2006.01) |
| *F16M 11/04* | (2006.01) |
| *F16M 11/16* | (2006.01) |
| *F16M 13/02* | (2006.01) |
| *G06F 1/18* | (2006.01) |
| *H05K 5/02* | (2006.01) |

(52) U.S. Cl.
CPC ............. *H05K 7/02* (2013.01); *F16M 11/046* (2013.01); *F16M 11/16* (2013.01); *F16M 13/022* (2013.01); *G06F 1/183* (2013.01); *H05K 5/0217* (2013.01); *F16M 2200/021* (2013.01)

(58) Field of Classification Search
CPC ...... H05K 5/02; H05K 5/0217; F16M 11/046; F16M 11/16; F16M 13/022; G06F 1/1658; G06F 1/183; G06F 1/1656; G06F 1/181
USPC .......................... 248/346.06; 403/408.1, 352
See application file for complete search history.

(56) References Cited

U.S. PATENT DOCUMENTS 6,493,233 B1 * 12/2002 De Lorenzo ........... H05K 3/325
                                                                     174/138 G
8,833,032 B2    9/2014 Schaefer et al.
(Continued)

FOREIGN PATENT DOCUMENTS

| CN | 204005114 | 12/2014 | |
|---|---|---|---|
| CN | 105096744 | 11/2015 | |
| WO | WO-2020060554 A1 * | 3/2020 | ........... G06F 1/1658 |

*Primary Examiner* — Todd M Epps
(74) *Attorney, Agent, or Firm* — HP Inc. Patent Department

(57) ABSTRACT

In an example, a movable standoff may include or be attached to a bracket having a post opening, and a post insertable into the post opening. The post may include a low shoulder portion disposed at a first end and a high shoulder portion. Further, the movable standoff may include a nut to fasten to a second end of the post, the first end being opposite from the second end. The high shoulder portion may be disposed in between the first end and the second end. The movable standoff may additionally include a bias member disposed in between the nut and the bracket.

15 Claims, 9 Drawing Sheets

(56) References Cited

U.S. PATENT DOCUMENTS

| | | | |
|---|---|---|---|
| 9,042,105 B2 * | 5/2015 | Malek | H05K 1/11 361/748 |
| 2005/0129461 A1 * | 6/2005 | Bruno | F16B 5/0208 403/408.1 |
| 2012/0025046 A1 | 2/2012 | Yen | |
| 2012/0137338 A1 | 5/2012 | Driggs et al. | |
| 2018/0235100 A1 * | 8/2018 | Lee | G11B 33/122 |

* cited by examiner

MOVABLE STANDOFFS WITH POSTS

BACKGROUND

Electronic devices may have a housing or enclosure within which components of the electronic device may be disposed. Such electronic devices, and thus enclosures thereof, may be continually reducing in size and/or footprint to make the electronic device more compact, sleek, and/or desirable to an end user. Additionally, electronic devices may include mounting structures and/or components to either mount an accessory to the electronic device, or to mount the electronic device to another device or stand.

DETAILED DESCRIPTION

Electronic devices, for example, desktop computers or workstations, are continually getting smaller and sleeker to save weight and space when using the electronic device. Additionally, electronic devices are getting smaller to achieve a better aesthetic and to be more desirable to an end user of the device. As such, space and volume within such devices, or enclosures, housings, or chasses thereof, is often at a premium, and wasting space may be undesirable. Further, it may sometimes be desirable to mount an electronic device to another device, mount, or stand, or to attach an accessory to the electronic device. As such, electronic devices may also include mounting structures and/or components to accomplish such tasks. In order to preserve the aesthetic appearance and sleek structure of an electronic device, it may be desirable to avoid having such mounting structures and components visible on the exterior of the electronic device when they are not in use, and, thus, such structures and components may be hidden within a housing or enclosure of an electronic device by a removable cover or panel.

In some situations, in order to utilize the mounting structures or components, the removable cover or panel may be removed, thereby exposing such mounting structures and components. However, since it may be desirable to maintain a sleek and attractive aesthetic of the electronic device, the removable cover may be recessed within or flush with the enclosure of the electronic device when the cover is attached. Therefore, when the cover is removed, the mounting structures or components may be recessed within the enclosure of the electronic device, in order to provide clearance for the removable cover or panel. As such, in some situations, attaching an accessory or a device to such mounting structures may be difficult, since the mounting structures may be recessed, at least partially, within the enclosure of the electronic device. In some situations, a spacer or adapter may be utilized with the mounting structures or components to effectively raise the attachment point to an accessory outside of the enclosure, however this may add cost and complexity to the electronic device.

Therefore, in some situations, it may be desirable to have mounting structures or components for an electronic device that may be hidden within an enclosure of the electronic device when not in use, and which may extend to an exterior of the electronic device when it is desirable to utilize the mounting structures or components, so as to make it easier to attach the electronic device to an accessory or other additional device.

Implementations of the present disclosure provide movable standoffs for the mounting of electronic devices to accessories or other devices. Examples of movable standoffs disclosed herein may be recessed within an enclosure of a device when not in use, and may also move and/or extend to protrude from the enclosure when it is desirable to utilize such standoffs.

Figure 1A:
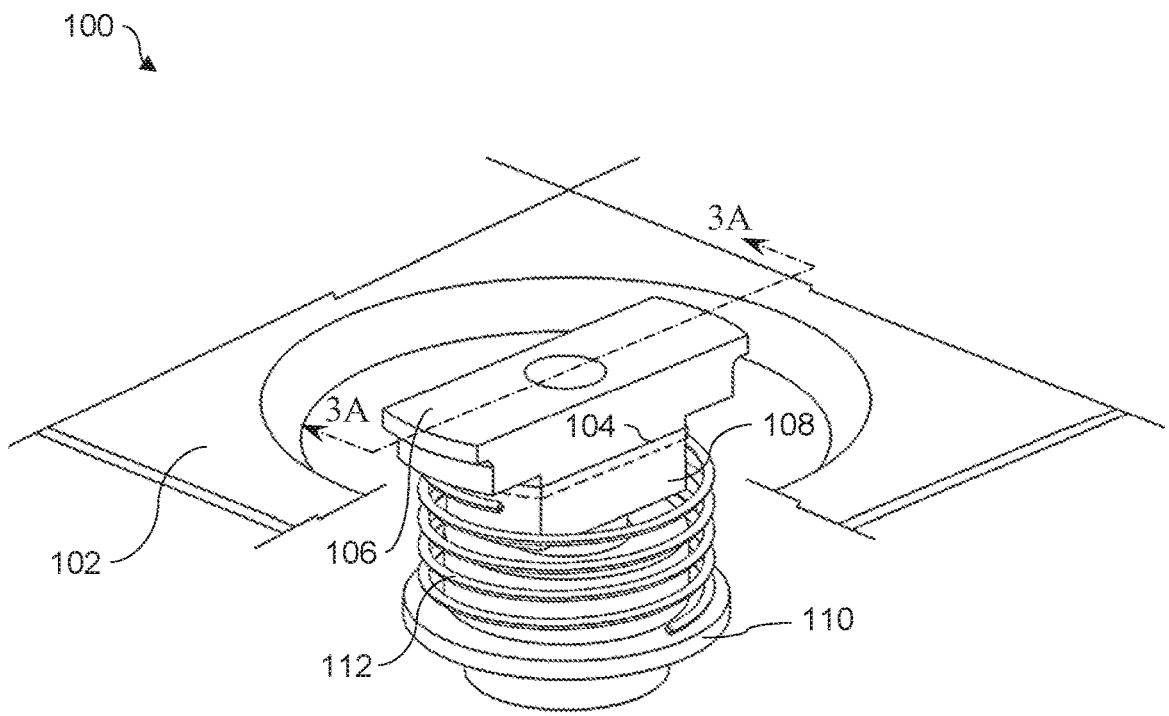
FIG. 1A is a perspective view of an example movable standoff.

Referring now to FIG. 1A, a perspective view of an example movable standoff 100 is illustrated. Movable standoff 100 may include or be attached to a bracket 102 having a post opening 104, and a post 106 insertable into the post opening 104. The post 106 may include a low shoulder portion disposed at a first end and a high shoulder portion 108. Further, the movable standoff 100 may include a nut 110 to fasten to a second end of the post 106, the first end being opposite from the second end. The high shoulder portion 108 may be disposed in between the first end and the second end. The movable standoff 100 may additionally include a bias member 112 disposed in between the nut 110 and the bracket 102. Note, FIGS. 1A-1C illustrate the bracket 102 as being cutaway to better illustrate the post 106, yet the post opening 104 is still illustrated to show how the post 106 may engage with the post opening 104.

The bracket 102, in some implementations, may be a substantially planar structure such as a plate, board, chassis, or a portion thereof. In some implementations, the bracket 102 may be a part of such a component that may already be a part of an electronic device, such as a chassis, housing, or board. In other implementations, the bracket 102 may be a standalone, dedicated component that is part of the movable standoff 100, and may be attached to another component, structural or other, of an electronic device in which the movable standoff 100 may be implemented. The bracket 102 may have a post opening 104 to receive the post 106, or a portion thereof. The post opening 104 may be a window, cutout, aperture, or other type of opening that extends through a thickness of the bracket 102 and is sized sufficiently to receive the post 106, or a portion thereof.

Figure 1B:
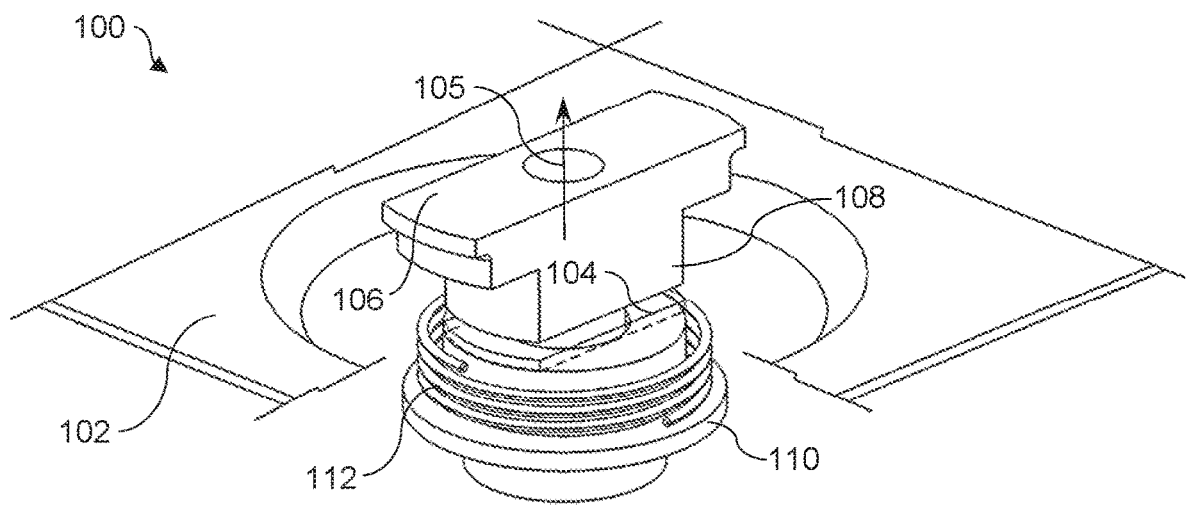
FIG. 1B is a perspective view of an example movable standoff.
Figure 1C:
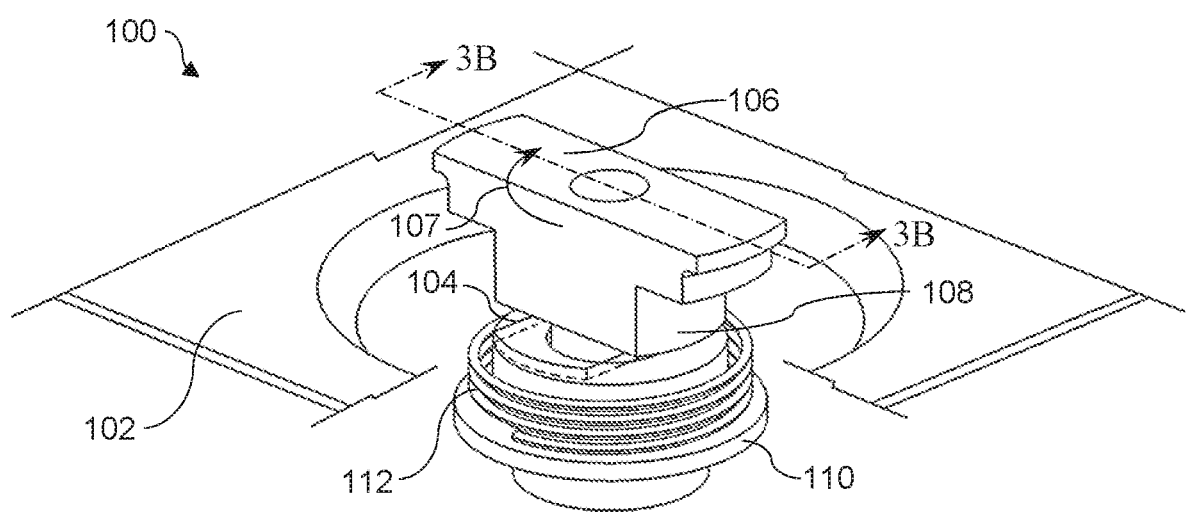
FIG. 1C is a perspective view of an example movable standoff.

Referring additionally to FIG. 1B, in some implementations, the post 106 may be a rigid or semi-rigid member that is movable through the post opening, for example along direction 105, relative to the bracket 102, between a released position, shown in FIG. 1A, and a raised position, shown in FIG. 1B. As is illustrated, the post 106 may be disposed within the post opening 104 such that one portion of the post 106, for example the first end, may be disposed on one side of the bracket 102, for example a top side, while another portion of the post 106, for example the second end, may be disposed on an opposing side of the bracket 102, for example an underside. This may be true, in some implementations, regardless of whether the post 106 is disposed in the released position or the raised position. The post 106 may have a longitudinal axis, along which the post 106 may be movable. The high shoulder portion 108 may be a portion or feature disposed on the post 106, and may be a shelf, ledge, protrusion or another feature having an edge and an associated plane which could support the post 106 against an urging of the bias member 112. Further, in some implementations, the high shoulder portion 108 may also be movable through the post opening 104, and in yet further implementations, the post opening 104 may have a matching or complementary profile to that of the post 106 and/or the high shoulder portion 108. In some implementations, the post 106 may be prevented from rotating about its longitudinal axis when disposed in the released position, or when moving through the post opening 104, due to the post 106, or the high shoulder portion 108 thereof, being rotatable, restrained by the shape, geometry or profile of the post opening 104. Further, the post 106 may move through the post opening 104, for example along direction 105, until the high shoulder portion 108 moves out of the post opening 104 and thus is no longer rotatably restrained by the post opening 104. Thus, the post 106 may be rotatable about its longitudinal axis if disposed in the raised position.

The movable standoff 100 may also include a nut 110, which may be disposed on, or attached or fastened to, the second end of the post 106. As such, the nut 110 may be disposed on the underside of the bracket 102 whether the post 106 is disposed in the released position or the raised position. The movable standoff 100 may also include a bias member 112, The bias member 112 may be disposed in between the first end and the second end, and, in some implementations, may be retained to the post 106 by the nut 110. The bias member 112 may be disposed in between the nut 110 and a surface of the underside of the bracket 102. The nut may be a mechanical component having a suitable structure to both attach to the second end of the post, and to also retain the bias member 112 and compress the bias member 112 upon the post 106 being moved from the released position to the raised position, as illustrated. For example, the nut 110 may include features such as a shoulder, ledge, retaining channel, protrusions, or other features to engage with the bias member 112. Thus, the bias member 112 may exert a force on the post 106 in the direction of the released position, or, in other words, the bias member 112 may resist the post 106 being moved towards the raised position. Therefore, the nut may be fixed to the second end of the post 106 such that the nut 110 and the post 106 are movable together. In some implementations, the nut 110 and the post 106, or the second end thereof, may have complementary features to support the nut being fastened and/or fixed to the post 106. E.g., in some implementations, the post 106 and the nut 110 may have complementary threads. In other implementations, the nut 110 may be attached to the post 106 in another manner, e.g., using a press fit or interference fit, or with a cross pin, etc.

In some implementations, the bias member 112 may be a resilient component capable of elastic deformation. In other words, the bias member 112 may be able to return to a starting geometry or position after undergoing a deformation. Further, the bias member 112 may exert or provide a reactive force in response to, and proportional to, a deformation it may undergo. In some implementations, the bias member 112 may be a spring, or a compression spring. In other implementations, the bias member 112 may be another type of spring, for example an extension spring, wave spring, torsion spring, or another type of resilient component capable of providing a reactive force in response to a deformation. As such, other positions and orientations of the spring are contemplated which correspond to the specific type of spring or resilient component being used. For example, if the bias member 112 were an extension spring, it may be attached to the nut in another manner in order to provide the appropriate bias force on the nut 110, and thus the post 106.

Referring now to FIG. 1C, the post 106 is illustrated as being disposed in the raised position and also as having been rotated about its longitudinal axis, for example along locking direction 107. Note, in some implementations, it may only be possible for the post 106 to rotate in a single rotational locking direction (e.g., direction 107), while in other implementations, the post 106 either may only be able to rotate in a direction opposite to direction 107, or may be able to rotate in both directions (i.e., clockwise and counterclockwise). In other words, the locking direction 107 may be any rotational direction, or may be a single rotational direction. The post 106 may have been rotated along the locking direction 107 to a locked position, wherein the post 106 and the high shoulder portion 108 thereof are disposed in a transverse manner across the post opening 104. In such a position, the high shoulder portion 108 may latch on to, or may extend across an edge of the post opening 104 such that the bias member 112 cannot urge or move the post 106 back through the post opening 104 towards the released position. Thus, the post 106 may be locked in the raised position when disposed in the locked position.

Figure 2:
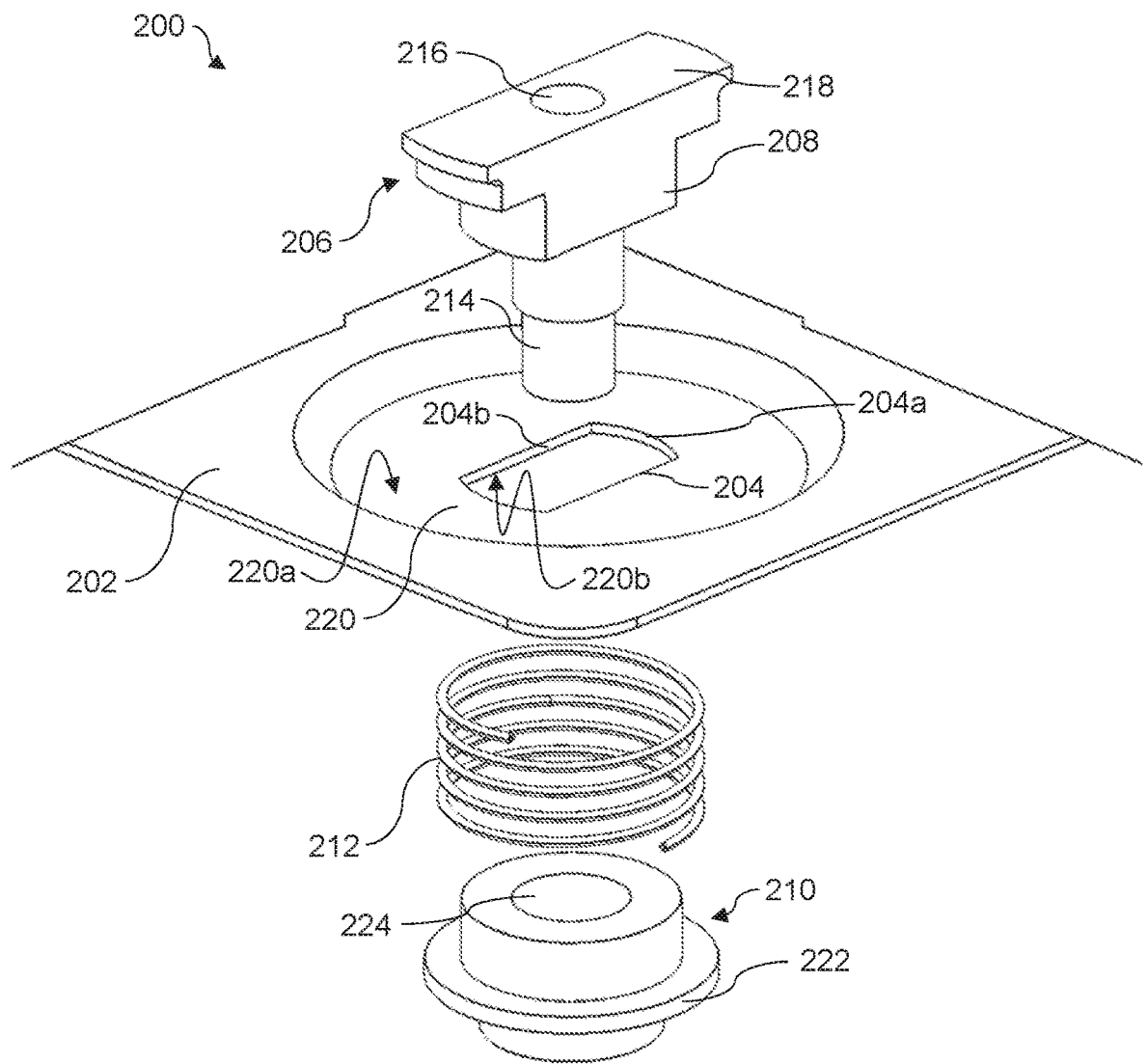
FIG. 2 is an exploded view of an example movable standoff.

Referring now to FIG. 2, an exploded view of an example movable standoff 200 is illustrated. Example movable standoff 200 may be similar to example movable standoff 100, described above. Further, the similarly-named elements of example movable standoff 200 may be similar in function and/or structure to the respective elements of example movable standoff 100, as they are described above. The movable standoff 200 may include a bracket 202 having a bracket opening 204, a post 206 having a high shoulder portion 208, a nut 210, and a bias member 212. The post opening 204 may have opposing clearance walls 204a, and opposing latching walls 204b. The clearance walls 204a may be structured or spaced apart from each other to provide clearance for the post 206, or the high shoulder portion 208 thereof, to move through the post opening 204. Additionally, the latching walls 204b may be structured or spaced apart from each other so as to provide a latching edge or edges for the high shoulder portion 208 to rest or latch on to if the post 206 is disposed in the locked position. In some implementations, the post opening 204 may have a complementary or substantially matching profile to that of the high shoulder portion 208, and may be aligned with the matching profile of the post 206 when the post is disposed in the released position or the raised (but not locked) position. Once the post 206 is rotated to the locked position, the profile of the post opening 204 and the high shoulder portion 208 may no longer be aligned, and therefore the post 206 may be unable to move back to the released position through the post opening 204 until the post 206 is rotated back. In other words, the post 206 may be pulled or moved from the released position, against the urging of the bias member 212, and rotated to the locked position, thereby locking the post 206 in the raised position. Correspondingly, the post 206 may be moved back to the released position by reversing the above steps, i.e., by rotating the post 206 from the locked position until the profile of the post opening 204 is aligned with the post 206, or the high shoulder portion 208 thereof, upon which the post 206 may be then be lowered or pulled by the bias member 212 back through the post opening 204 until a high shoulder portion of the post 206 is in contact with the bracket 202 in the released position.

The bracket 202 may further include a latching surface 220, the latching surface 220 having a top side 220a on one side of the bracket 202, and an underside 220b on an opposing side of the bracket 202. When the post is disposed in the raised position, the high shoulder portion 208 may clear or be moved above the top side 220a such that the post 206 can be rotated to the locked position without being restrained by the post opening 204, or the latching walls 204b thereof. Further, when the post 206 is disposed in the locked position, the high shoulder portion 208 may latch onto or rest against the top side 220a of the latching surface 220, and the bias member 212 may provide a reactive force against the underside 220b of the latching surface 220. In some implementations, the latching surface 220 may be a depressed or indented region of the bracket 202, as illustrated, and in other implementations, such an indentation or depression may be absent.

In some implementations, the post 206 may include a mounting surface 218 disposed at a first end of the post 206, the mounting surface 218 to receive and provide support for an accessory or device which may be attached to the post 206. Further, the post 206 may also include a fastener aperture 216 disposed in the mounting surface 218. The fastener aperture 216 may be structured and sized so as to receive a complementary fastener to attach such an accessory or device to the mounting surface 218. In some implementations, the fastener aperture 216 may be threaded to receive a threaded fastener, or may engage with a fastener in another manner, for example, through a press fit or slip fit. The post 206 may additionally include an attachment portion 214 disposed at a second end, opposite the first end and/or the mounting surface 218. The attachment portion 214 may be structured to mechanically or otherwise operably engage with the nut 210, or a complementary attachment portion 224 thereof. In some implementations, the attachment portion 214 may be threaded and may operably engage with complementary threads on the nut 210, or the complementary attachment portion 224 thereof. In other implementations, the attachment portion 214 may engage with the complementary, attachment portion 224 of the nut 210 in another manner, for example through a press fit or interference fit, or another suitable attachment method.

In some implementations, the nut 210 may include a nut shoulder portion 222 to engage or retain the bias member 212, or a wire rotation or portion thereof. The nut shoulder portion 222 may retain the bias member 212 when attached to the post 206 such that the nut 210 may transfer a reactive force of the bias member 212 to the bracket 202 when the bias member 212 is compressed or otherwise deformed in accordance with its design.

Figure 3A:
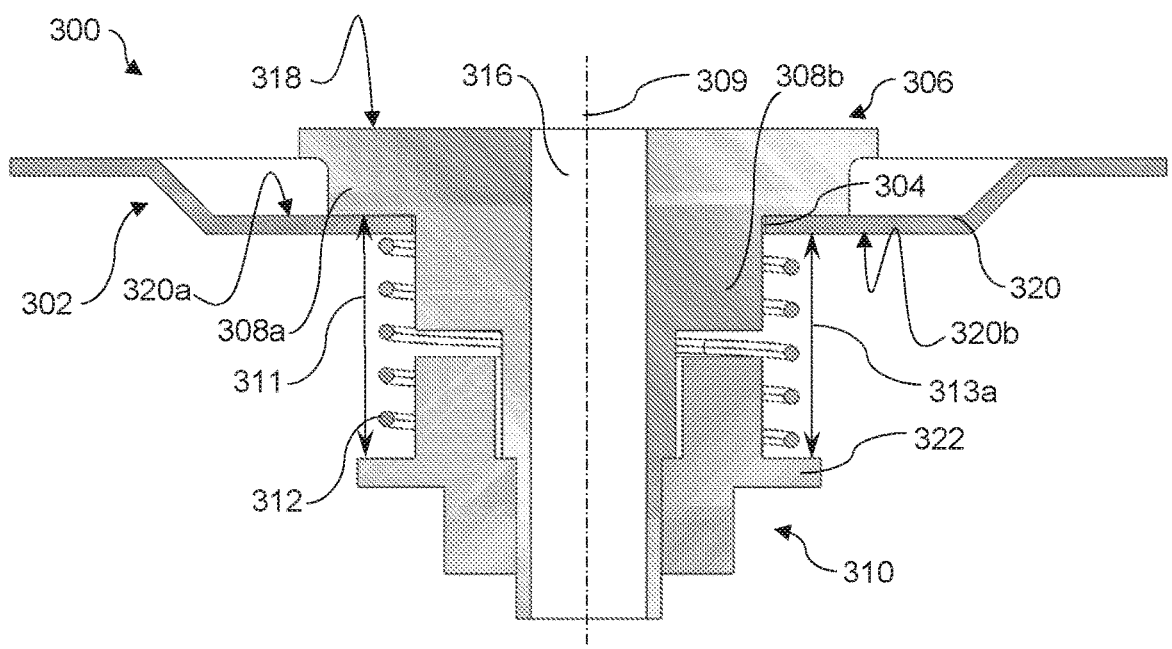
FIG. 3A is a cross-sectional view of an example movable standoff.

Referring now to FIG. 3A, a cross-sectional view of an example movable standoff 300 is illustrated, as taken along view line 3A-3A of FIG. 1A. Example movable standoff 300 may be similar to other example movable standoffs, described above. Further, the similarly-named elements of example movable standoff 300 may be similar in function and/or structure to the respective elements of other example movable standoffs, as they are described above. FIG. 3A illustrates the movable standoff 300 as being disposed in a released position. When disposed in the released position, a post 306 of the movable standoff 300 may be resting on or supported by a top side 320a of a latching surface 320 of a bracket 302. Further, the post 306 may include a low shoulder portion 308a disposed near or at a first end of the post 306, and a high shoulder portion 308b disposed adjacent the low shoulder portion 308a and towards a second end of the post 306, opposite the first end. The low shoulder portion 308a may be wider than the high shoulder portion 308b. In other words, the high shoulder portion 308b may be movable through a post opening 304 of the bracket 302, while the low shoulder portion 308a may not be able to fit through and move through the post opening 304. Thus, when the post 306 is disposed in the released position, the low shoulder portion 308b may be in contact with the latching surface 320.

The movable standoff 300 may also include a nut 310 attached to the second end of the post 306, and a bias member 312 disposed in between the nut 310 and the bracket 302, or an underside 320b thereof. The bias member 312 may urge the post 306 towards the direction of the released position, yet the low shoulder portion 308a, being in contact with the latching surface 320, may prevent the post 306 from being further moved in that direction by such urging of the bias member 312. The nut 310 may be fixedly attached to the second end of the post 306 so as to define a first spacing 311 between a bottom portion of the low shoulder portion 308a the part of the lower shoulder portion 308a in contact with the bracket 302 when the post 306 is in the released position) and a nut shoulder portion 322. Additionally, the nut 310 may be attached to the post 306 to additionally define a second spacing 313a between the nut shoulder portion 322 and the underside 320b of the latching surface 320 when the post 306 is in the released position. The post 306 may further have a fastener aperture 316 extending centrally through the post 306 along a longitudinal axis 309 of the post 306.

Figure 3B:
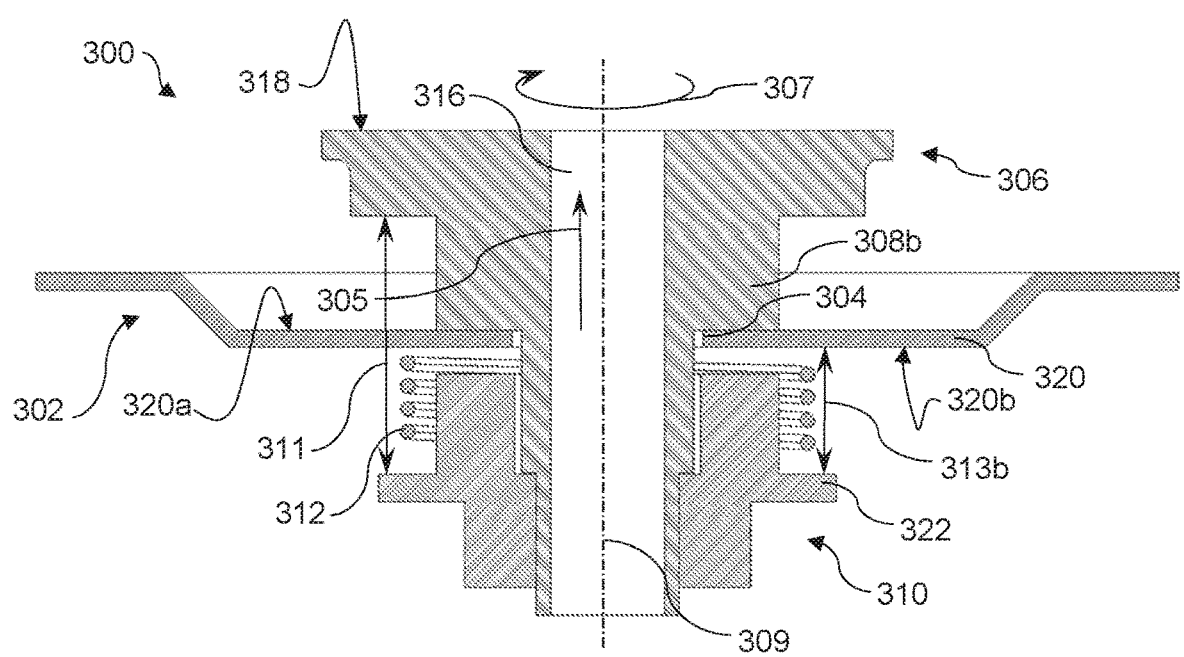
FIG. 3B is a cross-sectional view of an example movable standoff.

Referring additionally to FIG. 3B, a cross-sectional view, taken along view line 3B-3B of FIG. 1C, of example movable standoff 300 is illustrated wherein the post 306 has been moved, pulled, or otherwise transitioned from the released position to the raised position, for example along direction 305. Note, this transition of the post 306 is against the urging of the bias member 312. The post 306, once disposed in the raised position, has also been rotated along a locking direction 307 about its longitudinal axis 309 to a locked position. As illustrated, the nut 310 may be sufficiently attached to the second end of the post 306 so as to maintain the first spacing 311 through such a transition of the post 306. Upon being moved from the released position to the raised position, the low shoulder portion 308a comes out of contact with the latching surface 320 as the post 306 moves through the post opening 304. The post 306, in the raised position, is pulled far enough through the post opening 304 so as to define a clearance between the top side 320a of the latching surface 320 and the high shoulder portion 308b. Once this clearance is established, the post 306 is free to rotate in the locking direction 307 until the high shoulder portion 308b overhangs an edge of the post opening 304, whereupon the post 306 may be released and the bias member 312 may bring the high shoulder portion 308b into contact with the top side 320a of the latching surface. In the raised position, the bias member 312 is in a compressed state, and a third spacing 313b is defined between the nut shoulder portion 322 and the underside 320b of the latching surface 320. Third spacing 313b is smaller than second spacing 313a since the post 306 is extending through the post opening 304 to a greater degree than is illustrated in FIG. 3A.

Figure 4A:
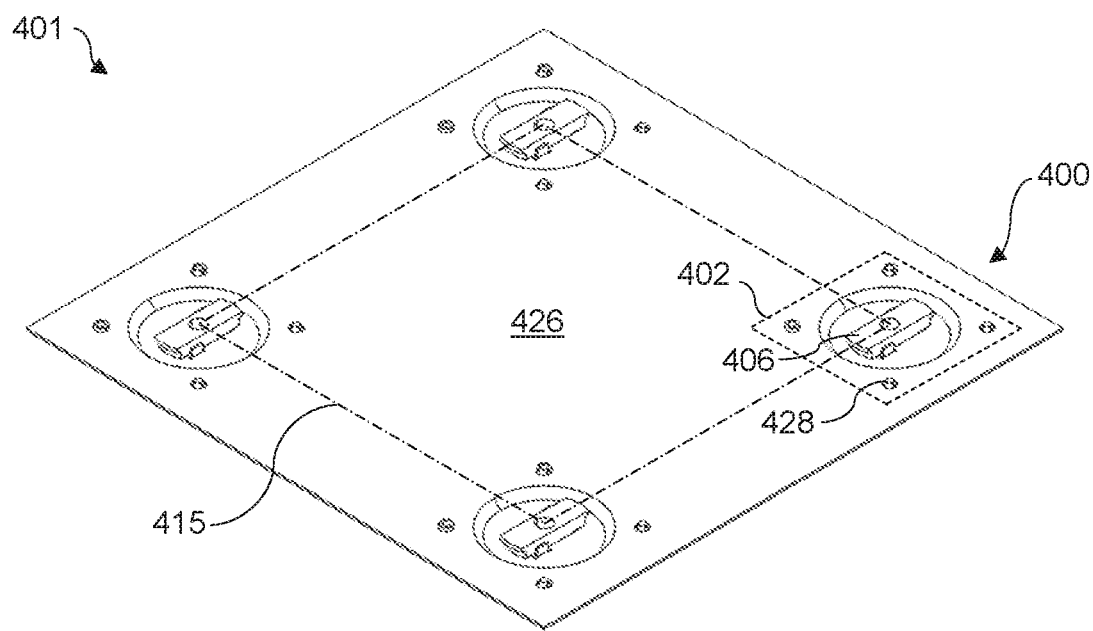
FIG. 4A is a perspective view of a mounting portion of an electronic device having an example movable standoff.
Figure 4B:
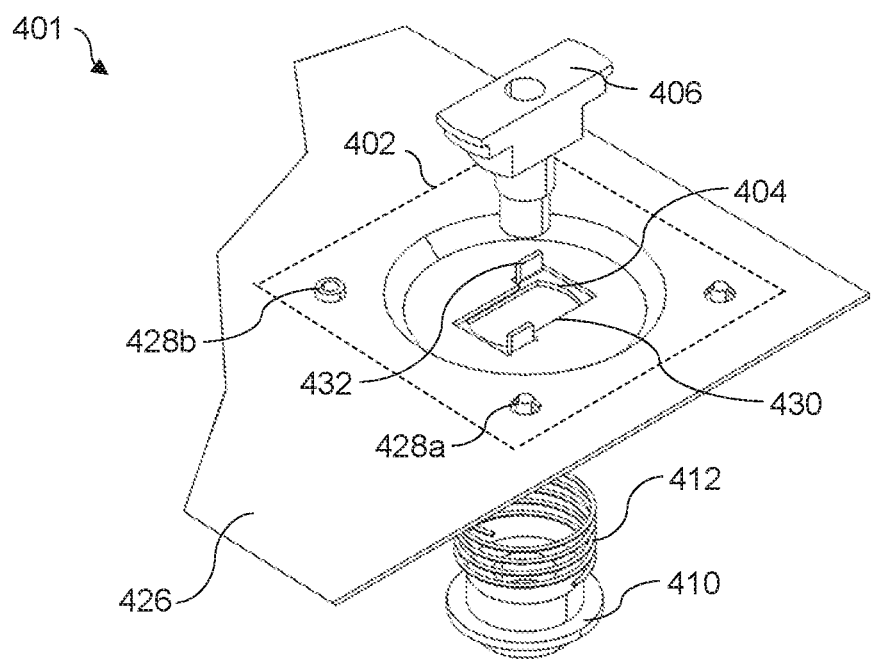
FIG. 4B is a detail perspective view of a mounting portion of an electronic device having an example movable standoff.

Referring now to FIG. 4A, a perspective view of a mounting portion 401 of an electronic device having a plurality of example movable standoffs 400 is illustrated. Note, in some implementations, the mounting portion 401 may have a different number of example movable standoffs 400 than as illustrated, including having just a single example movable standoff 400. Each example movable standoff 400 may be similar to other example movable standoffs, described above. Further, the similarly-named elements of example movable standoff 400 may be similar in function and/or structure to the respective elements of other example movable standoffs, as they are described above. Referring additionally to FIG. 4B, a detail view of the example mounting portion 401 is illustrated, wherein one of the plurality of movable standoffs 400 is illustrated in an exploded state.

The mounting portion 401 may include a plate 426 having a plurality of standoff openings 430. The plate 426 may be a rigid or semi-rigid member or panel. In some implementations, the plate 426 may be a standalone component to which the plurality of movable standoffs 400 are attached. In other implementations, the plate 426 may be an integrated part or component of an electronic device, such as a frame, housing, chassis, circuit board, or a portion or portions thereof. The plurality of standoff openings 430 may be arranged in a mounting pattern on the plate, illustrated by pattern 415. Similarly, the plurality of example movable standoffs 400 may also be arranged in such a mounting pattern 415 such that each of the plurality of movable standoffs 400, or a bracket 402 thereof, is aligned with one of the plurality of standoff openings 430. In some implementations, the mounting pattern 415 may be any pattern suitable to align the plurality of movable standoffs 400 with matching or complementary mounting points or features on an accessory or device to which the mounting portion 401, and thus an electronic device in which the mounting portion 401 is implemented, is to be attached or mounted. In further implementations, the mounting pattern 415 may be an industry standard mounting pattern, such as a Video Electronics Standards Association (VESA) Mounting Interface Standard (MIS). In yet further implementations, the mounting pattern 415 may be a rectangular arrangement having dimensions of approximately 100 mm×100 mm, 100 mm×50 mm, 100 mm×200 mm, 200 mm×50 mm, or another suitable industry standard mounting pattern.

Each example movable standoff 400 may include a bracket 402, which may be disposed on or attached to an underside of the plate 426, and thus is illustrated in hidden lines. In other implementations, the bracket 402 may be an integral part of the plate 426, or a portion of the plate 426 may act as the bracket 402, and a discrete or standalone bracket 402 may be omitted from the movable standoff 400. The bracket 402 may have a post opening 404, which may be aligned with a respective one of the plurality of standoff openings 430. Each of the plurality of standoff openings 430 may be a window, cutout, aperture, or other opening extending through a thickness of the plate 426. Thus, a post 406 of each of the plurality of movable standoffs 400 may be insertable into the post opening 404, and also the respective standoff opening 430 with which the post opening 404 is aligned. The post 406 of each of the plurality of movable standoffs 400 may be movable through the respective post opening 404 and standoff opening 430. The post 406 may be so movable between a released position and a raised position. Additionally, each post 406, when disposed in the raised position, may be rotated along a locking direction to a locking position, wherein the post 406 is retained in the raised position. Each of the plurality of movable standoffs 400 may also include a nut 410, and a bias member 412.

In some implementations, the plate 426 may also include a plurality of post stops 432. Each post stop 432 may be disposed adjacent to one of the plurality of standoff openings 430. Each post stop 432 may be a rigid or semi-rigid component, and, in some implementations, may be a unitary portion of the plate 426. For example, each post stop 432 may be a portion of the plate 426 that is bent in a vertical or substantially orthogonal direction to a plane of the plate 426. In other implementations, the plurality of post stops 432 may be discrete components that are assembled on to the plate 426. Further, each post stop 432 of the plurality of post stops 432 may be disposed sufficiently close to a standoff opening 430 so as to act as a stop or impediment to the rotation of a respective post 406. In other words, upon rotating to the locked position, the post 406 may then contact or hit the post stop 432 so as to be prevented from rotating beyond the locked position.

In some implementations, the bracket 402 of each of the plurality of movable standoffs 400 may be attached to the plate 426 by a plurality of rivets 428. In some implementations, the rivets 428 may be a part of the bracket 402, and insertable into complementary openings in the plate 426, and in other implementations, the rivets 428 may be a part of the plate 426 and insertable into complementary openings in the bracket 402. Once engaged with a complementary opening, each rivet may be pressed, stamped, or otherwise deformed to overlap the opening and retain the bracket 402 to the plate 426. FIG. 4B illustrates one rivet 428a in an undeformed state, and another rivet 428b in a deformed state for comparison.

Figure 5A:
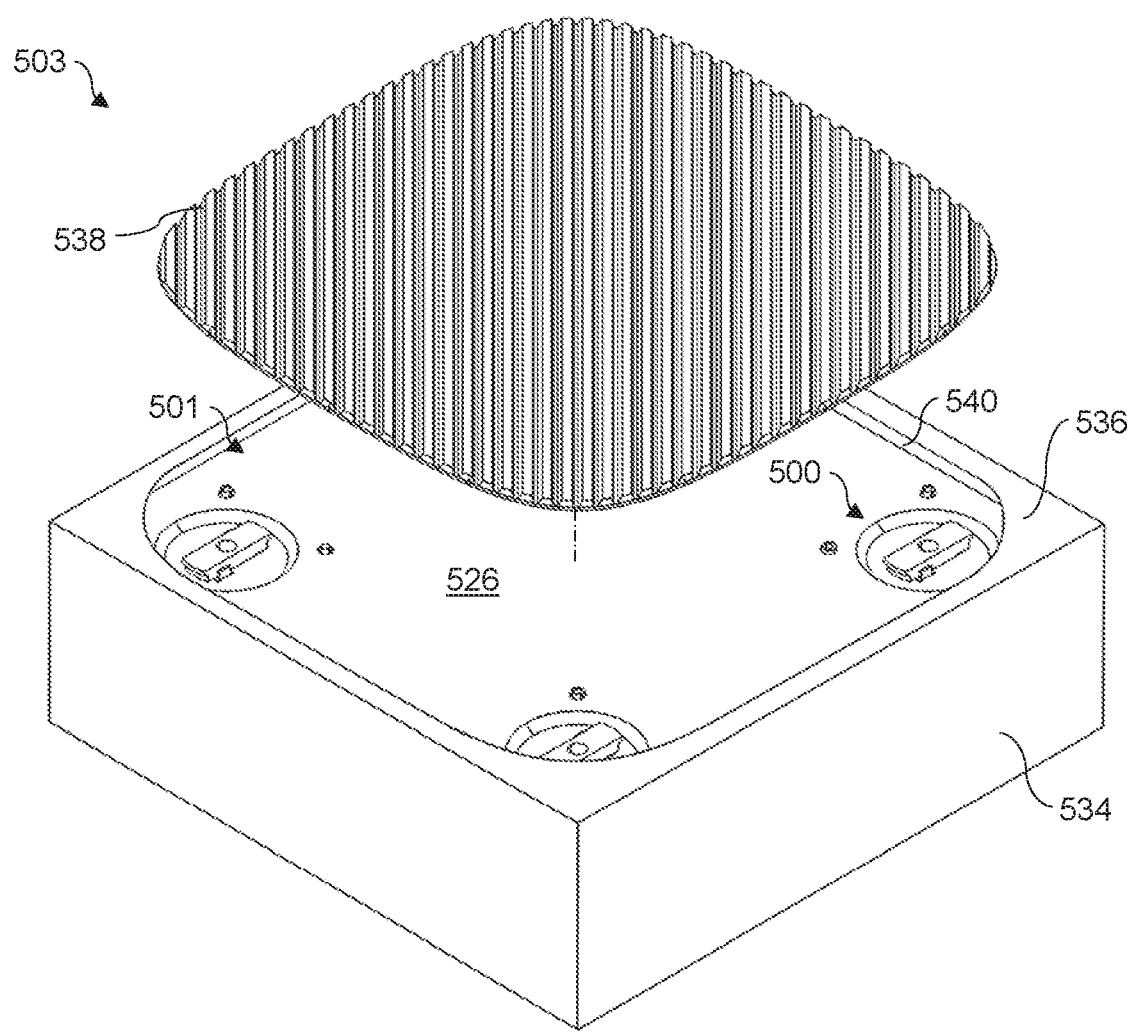
FIG. 5A is a perspective view of an example electronic device having an example movable standoff.

Referring now to FIG. 5A, a perspective view of an example electronic device 503 having a plurality of example movable standoffs 500 is illustrated. The electronic device 503, in some implementations, may be a computing device. In further implementations, the electronic device 503 may be a desktop personal computer (PC), a mini-desktop PC, an external PC accessory or expansion component, e.g., a graphics card, or another type of computing device or component. In other implementations, the electronic device 503 may be any type of electronic device with which it may be desirable to mount an accessory, e.g., a router, modem, cable box, uninterruptible power supply (UPS) or another type of electronic device.

Each example movable standoff 500 may be similar to other example movable standoffs, described above. Further, the similarly-named elements of example movable standoff 500 may be similar in function and/or structure to the respective elements of other example movable standoffs, as they are described above. The plurality of movable standoffs 500 may be arranged in a mounting pattern on a mounting portion 501 of the electronic device 503. Further, the electronic device 503 may have a chassis 534 having a mounting side 536. The mounting portion 501 may be disposed on the mounting side 536, and, in some implementations, may be at least partially disposed or recessed within the chassis 534. The chassis 534 may also house and support other components of the electronic device 503 including, but not limited to, circuit boards, processors, memory, power supplies, communication ports, hard drives, batteries, and/or other suitable components. The electronic device 503 may also have a mounting cover 538 which may removably attach or couple to the chassis 534. The chassis 534 may include a mounting cover recess 540 disposed over the mounting portion to receive the mounting cover 538 within the mounting cover recess 540. The mounting cover 538 may be attachable to the electronic device 503 so as to conceal the mounting portion 501 and the plurality of movable standoffs 500 if they are not to be utilized. In other words, when each of the plurality of movable standoffs 500 are in a released position, they may sit flush with, or below the mounting cover recess 540 such that the mounting cover 538 may sit within the recess and lie flush or flat with the rest of the chassis 534. As a result, when the mounting cover 538 is attached, the aesthetic and attractiveness of the chassis and the electronic device 503 as a whole may be preserved.

Figure 5B:
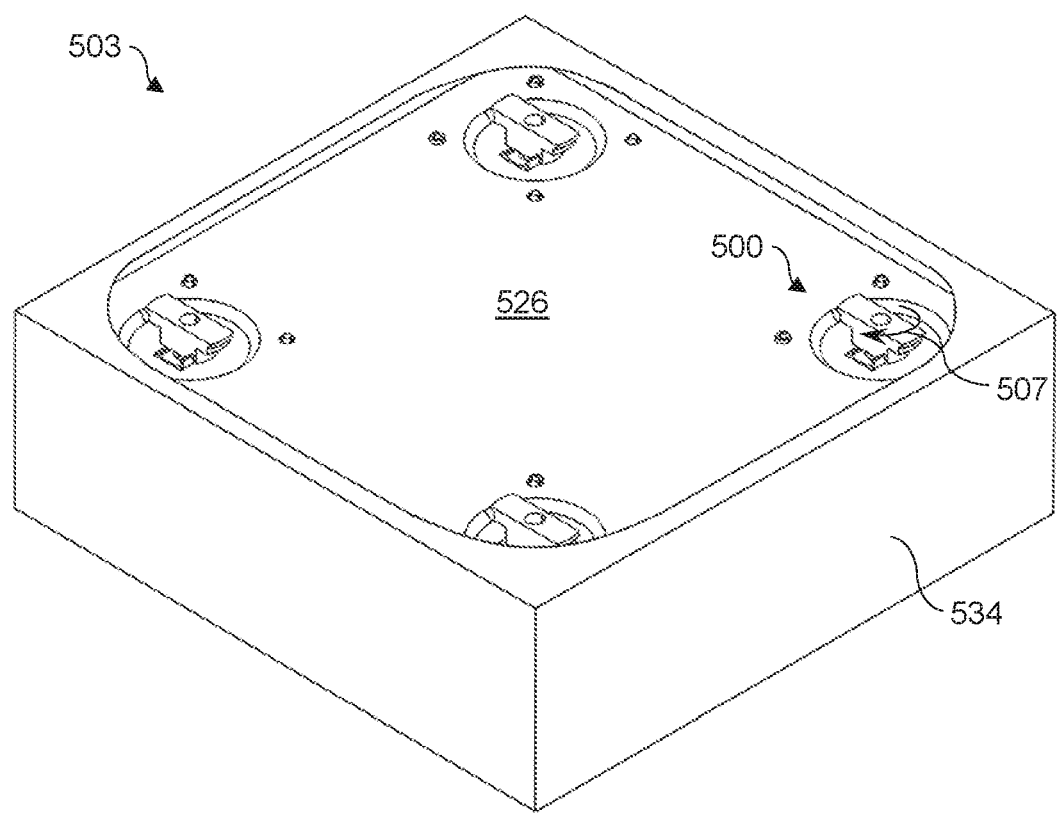
FIG. 5B is a perspective view of an example electronic device having an example movable standoff.

Referring now to FIG. 5B, a perspective view of the electronic device 503 is illustrated wherein the mounting cover 538 has been removed, thereby exposing the plurality of movable standoffs 500, and a post of each movable standoff 500 has been pulled or moved to a raised position from the released position and rotated along a locking direction 507 to a locked position. In the raised position, the post of each of the plurality of movable standoffs 500 may extend beyond the chassis 534 and out of the mounting cover recess 540. Thus, each post is now retained in the raised position and able to engage with a mounting point or component of an accessory outside of the chassis 534 without the use of an adapter plate.

Figure 5C:
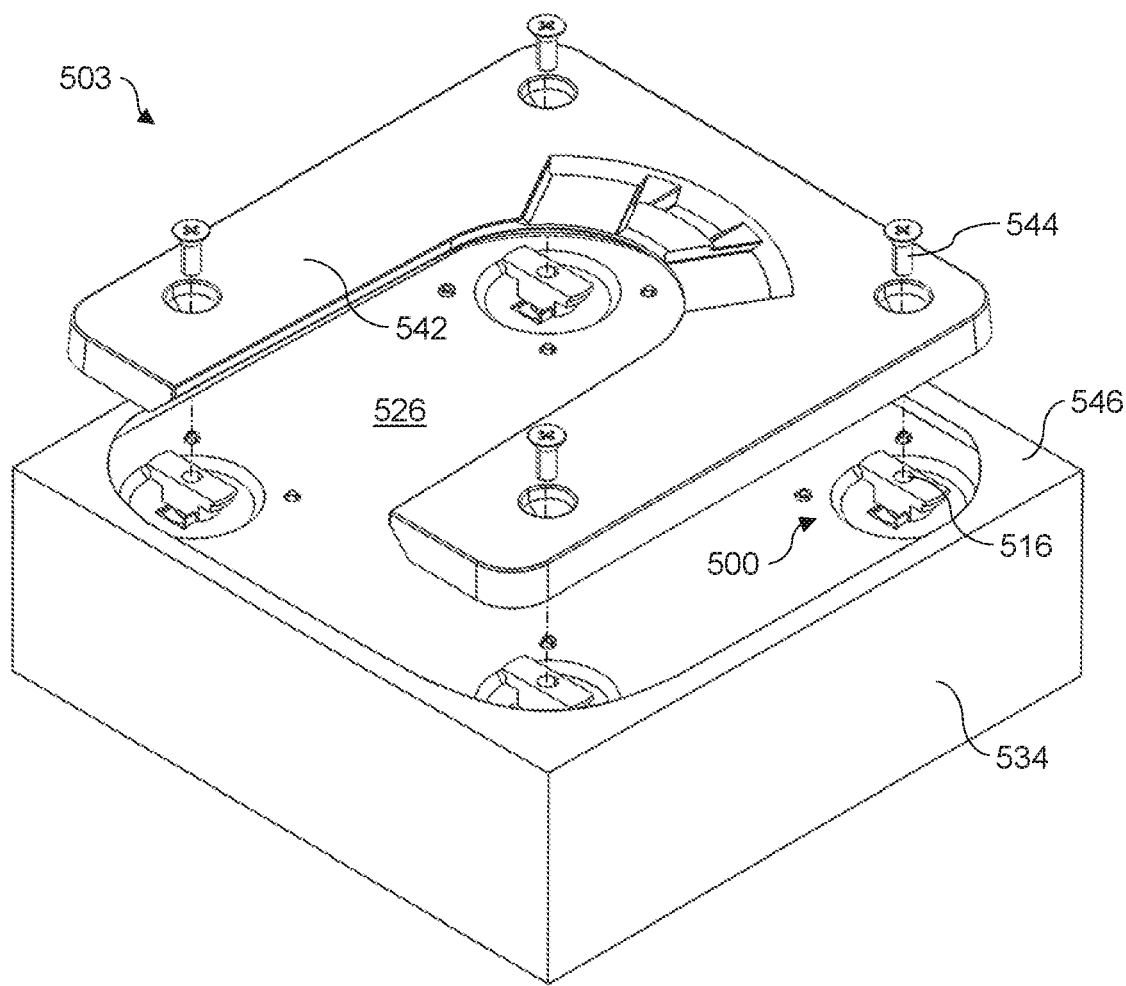
FIG. 5C is a perspective view of an example electronic device having an example movable standoff.
Figure 5D:
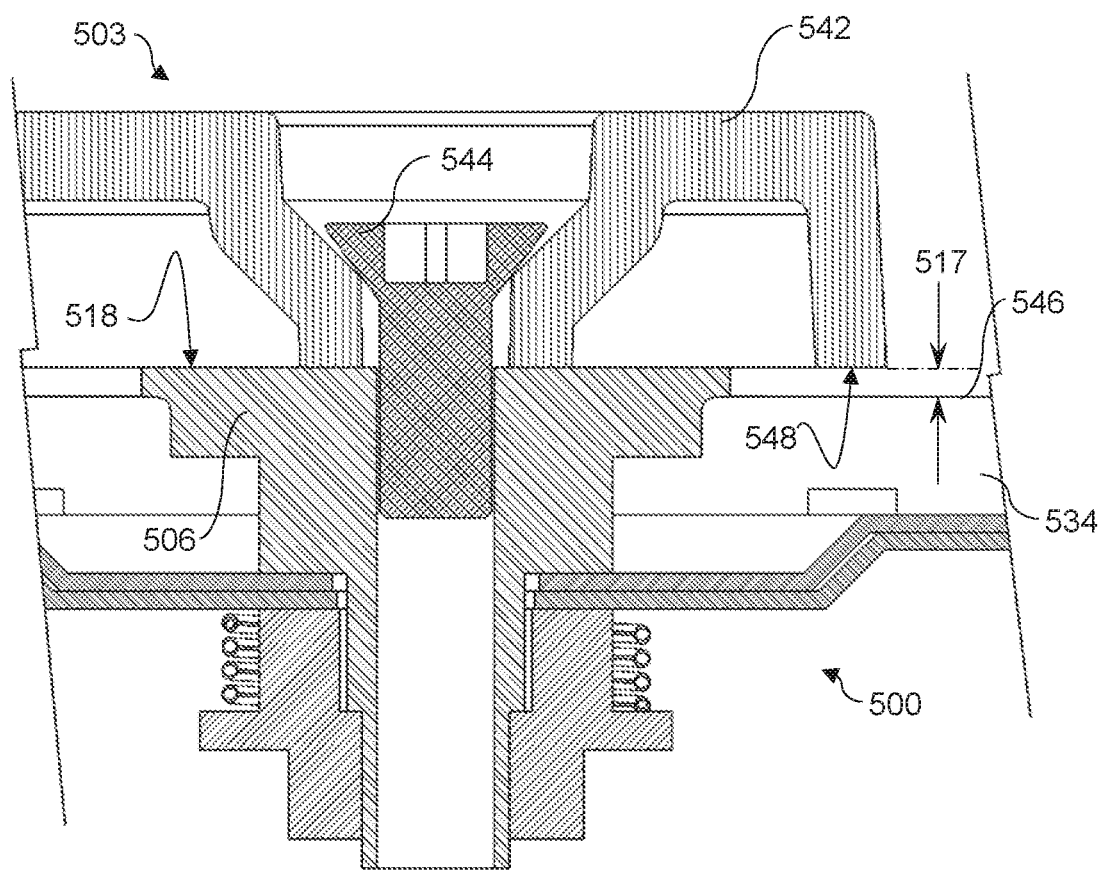
FIG. 5D is a cross-sectional view of an example electronic device having an example movable standoff.

Referring additionally to FIG. 5C, the electronic device 503 is illustrated as engaging with an accessory 542. The accessory 542 may be any component for which it might be desirable to have attached to the electronic device 503. For example, the accessory 542 may be a wall mount, monitor mount, stand, desk mount, or portions or brackets thereof. In other implementations, the accessory 542 may be another type of component, or another electronic device. The accessory 542 may be attached to the post of each movable standoff using a fastener 544, each of which may engage with and/or be received by a fastener aperture 516 of the respective post. Referring additionally to FIG. 5D, a cross-sectional view of one of the plurality of movable standoffs 500 of the electronic device 503 is illustrated as being fully engaged or attached to an accessory 542 with a fastener 544. The fastener 544 may rigidly mount a portion of the accessory to a mounting surface 518 of the post 506. Thus, the accessory 542 may be rigidly attached to the electronic device 503 by being attached to each or some of the movable standoffs 500.

As described above, when the post of each of the movable standoffs 500 is disposed in the raised and/or locked position, the mounting surface 518 may extend out of the mounting cover recess 540 so as to enable the simple and easy attachment of the accessory 542. As illustrated in FIG. 5D, due to such an extension of the post, when attached to the mounting surface 518, a lower-most portion or surface 548 of the accessory 542 may be spaced apart from an upper-most surface 546 of the chassis 534, for example by distance 517.

What is claimed is:

1. A movable standoff, comprising:
    a bracket having a post opening;
    a post insertable into the post opening, the post comprising a low shoulder portion disposed at a first end and a high shoulder portion;
    a nut to fasten to a second end of the post, the first end opposite from the second end; and
    a bias member disposed in between the nut and the bracket,
    wherein the high shoulder portion is disposed in between the first end and the second end.

2. The movable standoff of claim 1, wherein the post is movable through the post opening relative to the bracket between a released position and a raised position.

3. The movable standoff of claim 2, wherein the high shoulder portion is movable through the post opening from the released position to the raised position.

4. The movable standoff of claim 3, wherein the post is rotatable about a longitudinal axis of the post in a locking direction to a locked position if the post is disposed in the raised position, and wherein the high shoulder is to latch on to the post opening if the post is disposed in the locked position.

5. The movable standoff of claim 1, wherein the post opening has opposing clearance walls and opposing latching walls.

6. The movable standoff of claim 1, wherein the post further includes a fastener aperture disposed in a mounting surface of the post.

7. The movable standoff of claim 1, wherein the post further includes an attachment portion at the second end to mechanically engage with the nut.

8. The movable standoff of claim 7, wherein the attachment portion is threaded and is to engage with complementary threads on the nut.

9. A mounting portion of an electronic device, comprising:
    a plate having a plurality of standoff openings; and
    a plurality of movable standoffs arranged in a mounting pattern, each movable standoff comprising:
        a bracket having a post opening aligned with one of the plurality of standoff openings;
        a post insertable into the post opening and the respective standoff opening and movable through the post opening between a released position and a raised position, the post comprising a low shoulder portion disposed at a first end and a high shoulder portion;
        a nut to fasten to a second end of the post, the first end opposite from the second end; and
        a bias member disposed in between the nut and the bracket, the bias member to urge the post towards the released position.

10. The mounting portion of claim 9, wherein; if disposed in the raised position, the post is rotatable along a locking direction to a locked position, and wherein the high shoulder portion is to latch on to the post opening if disposed in the locked position.

11. The mounting portion of claim 10, wherein the plate includes a plurality of post stops, each post stop disposed adjacent to one of the plurality of standoff openings.

12. The electronic device of claim 10, further comprising a mounting cover to removably attach to the chassis within the mounting cover recess.

13. An electronic device, comprising:
    a chassis;
    a mounting portion disposed on a mounting side of the chassis, the mounting portion comprising:
        a plurality of movable standoffs arranged in a mounting pattern, each movable standoff comprising:
            a bracket having a post opening;
            a post insertable into the post opening and movable through the post opening between a released position and a raised position, the post comprising a low shoulder portion disposed at a first end to latch on to the post opening if disposed in the released position, and a high shoulder portion disposed adjacent the low shoulder portion;

a nut to fasten to a second end of the post, the first end opposite from the second end; and a bias member disposed in between the nut and the bracket to urge the post towards the released position, wherein the post is rotatable to a locked position if disposed in the raised position, the high shoulder portion to latch on to the post opening if disposed in the locked position.

14. The electronic device of claim 13, wherein the mounting portion is disposed within the chassis of the electronic device on the mounting side, and wherein the chassis includes a mounting cover recess disposed over the mounting portion.

15. The electronic device of claim 13, wherein the mounting pattern is a VESA mounting pattern.

* * * * *